US012615019B2

(12) United States Patent
Geffroy

(10) Patent No.: US 12,615,019 B2
(45) Date of Patent: Apr. 28, 2026

(54) SYSTEM AND METHOD OF PROTECTING A LOW VOLTAGE CAPACITOR OF AN ERROR AMPLIFIER OPERATING IN A HIGHER VOLTAGE DOMAIN

(71) Applicant: NXP B.V., Eindhoven (NL)

(72) Inventor: Vincent Geffroy, Cuverville (FR)

(73) Assignee: NXP B.V., Eindhoven (NL)

( * ) Notice: Subject to any disclaimer, the term of this patent is extended or adjusted under 35 U.S.C. 154(b) by 455 days.

(21) Appl. No.: 18/452,204

(22) Filed: Aug. 18, 2023

(65) Prior Publication Data

US 2024/0097620 A1    Mar. 21, 2024

(30) Foreign Application Priority Data

Sep. 21, 2022    (EP) ..................................... 22306381

(51) Int. Cl.
    *H03F 3/45* (2006.01)
    *H03F 1/30* (2006.01)
(52) U.S. Cl.
    CPC ......... *H03F 1/303* (2013.01); *H03F 3/45179* (2013.01); *H03F 2200/141* (2013.01)
(58) Field of Classification Search
    CPC ................. H03F 1/303; H03F 3/45179; H03F 2200/141; H03F 2200/297; H03F 2200/381; H03F 2203/45008; H03F 2203/45178; H03F 2203/45418; H03F 2203/45641; H03F 2203/45642; H03F 2203/45691; H03F 2203/45701; H03F 2203/45702; H03F 2203/45716; H03F 3/45183; H03F 3/45659; H03F 1/523; G05F 1/575

USPC .......................................................... 330/253
See application file for complete search history.

(56) References Cited

U.S. PATENT DOCUMENTS

| | | | |
|---|---|---|---|
| 4,633,162 A | 12/1986 | Melbert | |
| 5,083,051 A | 1/1992 | Whatley et al. | |
| 6,703,813 B1 | 3/2004 | Vladislav et al. | |
| 7,994,858 B2 | 8/2011 | Standley et al. | |
| 2006/0017504 A1 | 1/2006 | Deval et al. | |
| 2013/0169251 A1* | 7/2013 | Wan .......................... | G05F 1/56 323/282 |
| 2015/0205314 A1 | 7/2015 | Hayashi et al. | |
| 2020/0272184 A1 | 8/2020 | Petenyi | |

* cited by examiner

*Primary Examiner* — Andrea Lindgren Baltzell
*Assistant Examiner* — Khiem D Nguyen

(57) ABSTRACT

An error amplifier including a differential pair circuit, a resistive device, a low voltage capacitor, and a protection device. The differential pair circuit is coupled between an upper supply node and a lower supply node with first and second intermediate nodes and is responsive to a difference between a reference voltage and a feedback voltage for driving a control voltage developed on the second interme- diate node. The resistive device is coupled between the second intermediate node and a low voltage node, and the low voltage capacitor and the protection device are coupled between the low voltage node and the lower supply node. The protection device is dynamically controlled by the first intermediate node to prevent the low voltage node from exceeding a predetermined maximum level. The protection device may be a transistor having size parameters based on voltage characteristics of the first intermediate node during expected operating conditions.

20 Claims, 3 Drawing Sheets

SYSTEM AND METHOD OF PROTECTING A LOW VOLTAGE CAPACITOR OF AN ERROR AMPLIFIER OPERATING IN A HIGHER VOLTAGE DOMAIN

CROSS-REFERENCE TO RELATED APPLICATIONS

This application claims the priority under 35 U.S.C. § 119 of application Ser. No. 22/306,381.9, filed on 21 Sep. 2022, the contents of which are incorporated by reference herein.

BACKGROUND

Field of the Invention

The present invention relates in general to voltage regulators, and more particularly to a system and method of protecting a low voltage capacitor provided in an error amplifier of a voltage regulator operating in a higher voltage domain.

Description of the Related Art

Resistor-Capacitor (RC) circuits may be used in electronic control circuits for feedback loop stabilization. Analog components, including capacitors and the like, may be embedded within the integrated circuitry. In some applications or for certain configurations, space constraints may be placed on the integrated components, such as, for example, large capacitors. In addition, certain applications, such as automotive applications and the like, exhibit extreme process, voltage, and temperature conditions having relatively wide variations. The circuitry including integrated analog components need to meet electrical conditions while also withstanding process, voltage, and temperature variations and conditions.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A large-valued, high-density, low-voltage capacitor may be included for feedback loop stabilization in a low-dropout (LDO) voltage regulator operating in a higher voltage domain. Given circuit and spacing constraints in many configurations, alternative capacitor options may not be available in order to achieve circuit area optimization.

During certain operating phases of the circuit, such as at startup or during current limitation operation, a differential pair circuit of the regulator falls out of linear mode causing the voltage potential across the low-voltage capacitor to rise above a predetermined maximum voltage rating level. A dynamically-driven protection device acting as a voltage clamp is added to protect the low-voltage capacitor. The protection device is dynamically activated before the over-voltage condition is reached causing current to flow through a stabilization resistor coupled in series with the capacitor. The protection device is dynamically activated by an opposite polarity of the differential pair so that the voltage across the low-voltage capacitor is prevented from exceeding the maximum voltage level. Dynamic activation also enables optimal circuit operation within the linear mode.

Figure 1:
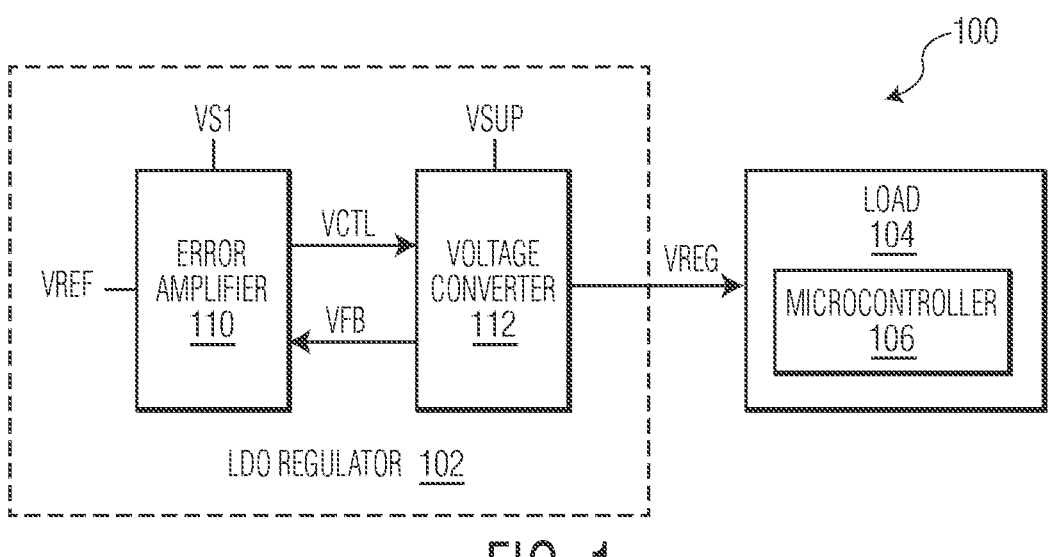
FIG. 1 is a simplified block diagram of an electronic system including a voltage regulator with an error amplifier implemented according to one embodiment providing a regulated voltage to a load.

FIG. 1 is a simplified block diagram of an electronic system 100 including an LDO regulator 102 with an error amplifier 110 implemented according to one embodiment providing a regulated voltage VREG to a load 104. The load 104 generally includes electronic circuitry including, for example, a microcontroller 106 or the like. The microcontroller 106 is simply used as an example to illustrate importance of maintaining VREG within a regulated voltage range during various conditions. The LDO regulator 102 includes the error amplifier 110 and a voltage converter 112. The error amplifier 110 receives a source voltage VS1, a reference voltage VREF, and a feedback voltage VFB, and provides a control voltage VCTL. The voltage converter 112 is coupled to a supply voltage VSUP, receives the control voltage VCTL, and provides the feedback voltage VFB for regulating the voltage level of VREG.

During nominal operating conditions, the LDO regulator 102 regulates VREG at a voltage level based on VREF, in which VREF has a static voltage level and is used as a reference to determine the voltage level of VREG. It is desired that VREG be maintained within a predetermined operating voltage range suitable for the load 104. Under certain extreme conditions, such as a sudden drop of VSUP, the voltage converter 112 adjusts VFB causing the error amplifier 110 to drive VCTL in such a manner in an attempt to maintain VREG within the predetermined operating voltage range. In one embodiment, for example, the electronic system 100 is used in an automotive environment in which VSUP may be provided by an automotive battery or the like. Upon ignition to start the automobile, VSUP may be driven to a lower voltage level which otherwise causes VREG to decrease. The voltage converter 112 adjusts VFB and the error amplifier 110 responds by driving VCTL to whatever level is necessary maintain the voltage level of VREG from dropping below the predetermined operating voltage range.

Figure 2:
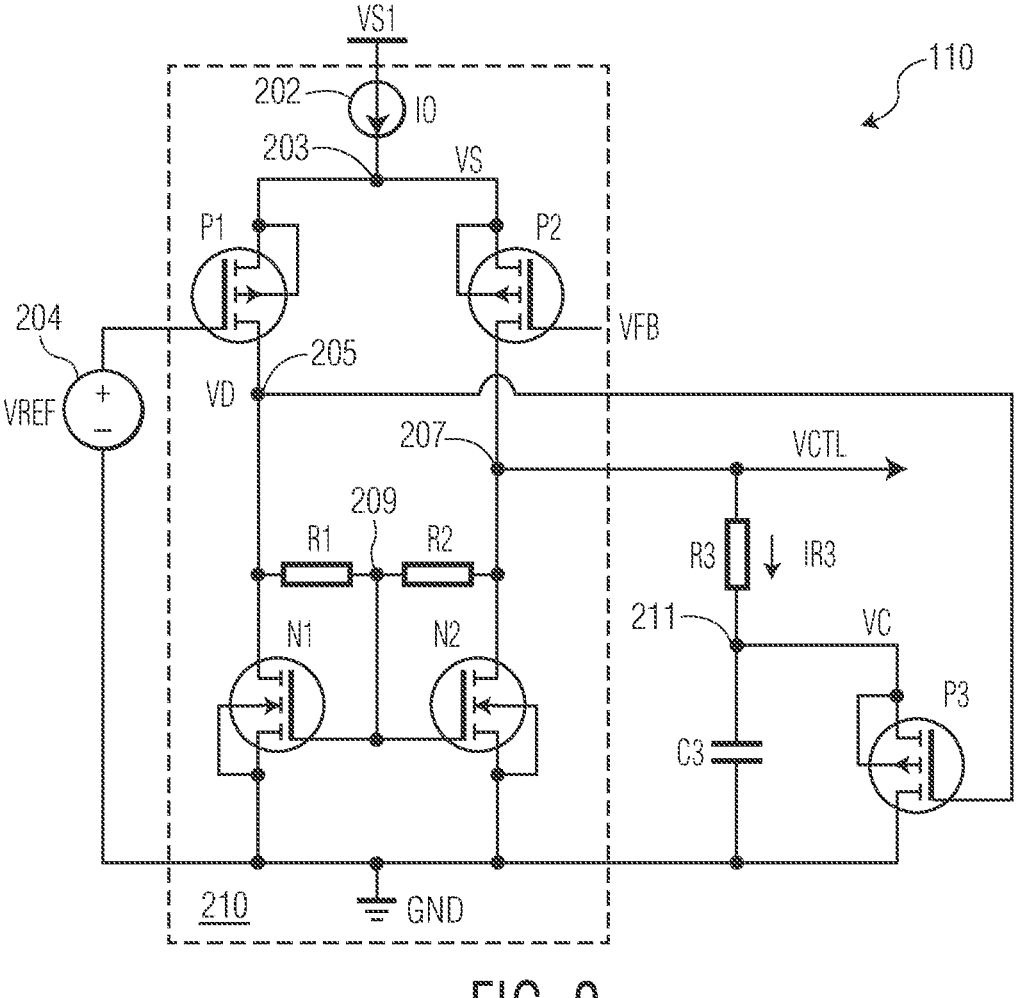
FIG. 2 is a schematic diagram of the error amplifier of FIG. 1 implemented according to one embodiment.

FIG. 2 is a schematic diagram of the error amplifier 110 implemented according to one embodiment. The error amplifier 110 includes a current source 202, a voltage source 204 developing VREF, P-channel or P-type transistors P1, P2, and P3, N-channel or N-type transistors N1 and N2, resistors R1, R2, and R3, and a capacitor C3. Each of the transistors P1-P3 and N1-N2 have a pair of current terminals, such as drain and source terminals or the like, and a control terminal, such as a gate terminal or the like. In one embodiment, the transistors are MOS type transistors in which P1-P3 are PMOS transistors and N1-N2 are NMOS transistors, although alternative transistor types are contemplated. The source voltage VS1 is referenced to a supply reference node, such as ground (GND), which may have any suitable positive, negative, or zero voltage level. In one non-limiting embodiment, GND is 0 Volts (V), VREF is about 1V, VS1 is about 5V, VSUP has a nominal voltage of about 12V (which varies depending upon operating conditions), and VREG is regulated between 6V and 7V.

The current source 202 is coupled between VS1 and a source node 203 developing a voltage VS, in which the current source 202 drives a current IO to node 203. P1 and P2 each have a source terminal coupled to node 203. P1 has a drain terminal coupled to a first intermediate node 205 developing a voltage VD, and P2 has a drain terminal coupled to a second intermediate node 207 developing the control voltage VCTL. The voltage source 204 has a first terminal coupled to GND and has a second node coupled to a gate terminal of P1 for driving the gate terminal of P1 to VREF. The feedback voltage VFB is provided to a gate terminal of P2. N1 has a drain terminal coupled to node 205, a source terminal coupled to GND, and a gate terminal coupled to a gate node 209. N2 has a drain terminal coupled to node 207, a source terminal coupled to GND, and a gate terminal coupled to the gate node 209. R1 is coupled between nodes 205 and 209 and R2 is coupled between nodes 207 and 209.

The current source 202, the transistors P1-P2 and N1-N2, and the resistors R1 and R2 collectively form a differential pair circuit 210 with a resistive common-mode feedback load that is responsive to a difference between VREF and VFB for driving VCTL to regulate the voltage level of VREG. The current source 202 feeds current to the differential pair of transistors P1 and P2 receiving VFB and VREF. N1 and N2 and the resistors R1 and R2 form the resistive common-mode feedback load.

R3 and C3 are added for feedback loop stabilization as further described herein. R3 is coupled between node 207 and a low voltage node 211 developing a voltage VC. C3 is coupled between node 211 and GND. P3 is a protection device controlled by VD that is provided to protect C3 as further described herein. P3 has a source terminal coupled to node 211, a drain terminal coupled to GND, and a gate terminal coupled to node 205. A current IR3 is shown flowing through R3.

In one embodiment, C3 is a relatively large-valued, high-density, low-voltage capacitor used for feedback loop stabilization which is placed into a higher voltage regulator for circuit area optimization. Although C3 is coupled to the low voltage node 211, which is intended to maintain a low voltage level during nominal operating conditions, the error amplifier 110 operates with voltage levels that are higher than the maximum rated voltage level of C3. During certain phases of circuit operation, such as circuitry boot-up, automobile start-up, current limitation caused by a short in the load 104, etc., VSUP is driven low causing the voltage of VREG to decrease by an amount that may cause the LDO regulator 102 to exit regulation mode. The differential pair P1 and P2 are within a negative feedback loop of the error amplifier 110 in which VFB is driven low to control VCTL in an attempt to prevent VREG from falling out of regulation. VFB falls below VREF by an increasing amount so that a large portion of the current IO is derived through transistor P2, which causes VCTL to rise much higher than its nominal level during normal operation. Ignoring, for the moment, operation of P3, the current IR3 through R3 remains negligible (such as only a leakage current) so that that the voltage level of VC follows VCTL. In this manner, the voltage level of VC, and thus the resultant voltage potential across C3, increases and otherwise rises above its maximum rated voltage level. Such an over-voltage condition results in safety and reliability issues of the circuit. C3, for example, may fail catastrophically resulting in safety concerns, or at least may be sufficiently stressed over time causing it to fail prematurely raising significant reliability concerns.

P3 is provided as a protection device to ensure that the voltage potential applied across the low-voltage capacitor C3 does not exceed its maximum rated voltage level. As VCTL rises and opposing node VD decreases, P3 turns on so that the voltage of VD≈VC+|VthP3| in which VthP3 is the threshold voltage of P3. P3 is activated to reduce the voltage of VC relative to VCTL so that the current IR3 through R3 increases to allow VC separate from VCTL. Under these conditions, the voltage drop across R3 is sufficiently increased to keep the voltage of VC below the maximum rated voltage level of C3. P3 activation is determined by the voltage to current characteristic of the differential pair P1 and P2, the resistance of the load resistors R1 and R2, and by threshold voltage modulation. P3 is dynamically driven to operate as a dynamic voltage clamp for the capacitor C3. By combining the benefit of the dynamically activated clamp current flowing through the stabilization resistor R3, and control by voltage VD at the opposite output of the differential pair, the voltage across C3 is limited to a predetermined maximum voltage level. Such operation of the P3 enables a safe operating criteria under most if not all extreme process, voltage, temperature, temperature and load current conditions.

Figure 3:
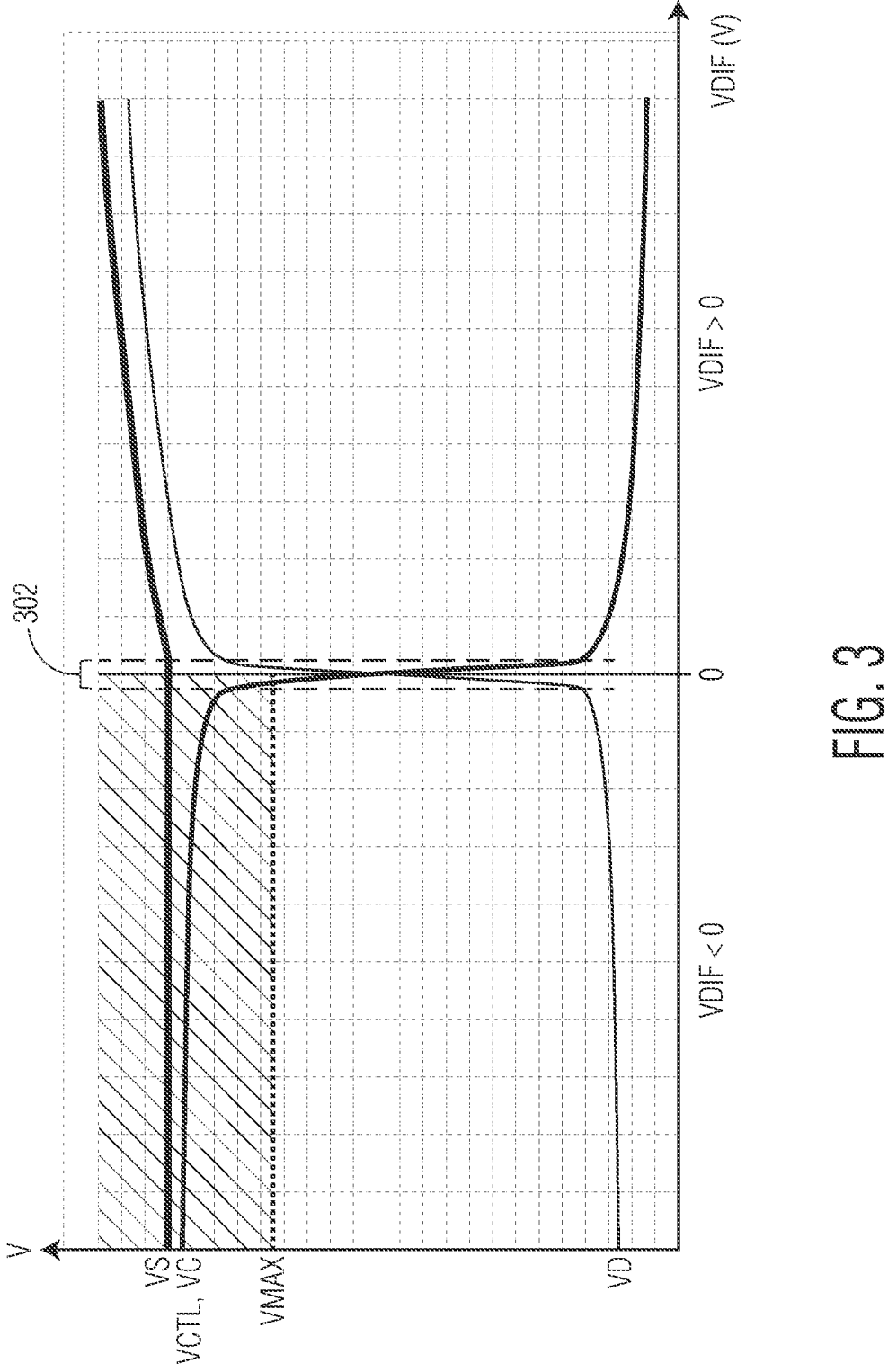
FIG. 3 is a graphic diagram plotting various voltages of the error amplifier of FIG. 1 without a protection device for the low voltage capacitor.

FIG. 3 is a graphic diagram plotting the voltages VS, VCTL, VC, VD, and VMAX versus a difference voltage VDIF=VFB−VREF for the error amplifier 110 without the protection device P3 (i.e., assuming P3 is absent or otherwise non-operative). Since IR3 is a negligible leakage current through R3 in this case, VCTL and VC maintain substantially the same voltage level for the entire range of VDIF and thus are plotted together along the same line. VMAX is a maximum rated voltage level for the capacitor C3 and is plotted using a dashed line. The voltage scale is not shown since particular voltage levels may vary for different implementations. In one embodiment, VDIF plotted along the horizontal axis ranges from left to right from about −0.55V to about 0.55V centered at 0V, and the vertical axis from bottom to top ranges from about 0V to about 2.5V. A linear region 302 is illustrated between dashed lines when VFB and VREF are relatively close (e.g., within 2% of each other) so that VDIF is near 0V. As VFB falls below VREF so that VDIF goes negative, operation transitions out of the linear region 302 and VCTL and VC both rise above VMAX. In this manner, VC rises above VMAX and thus above the safe operating limit of the capacitor C3 presenting an undesired condition.

Although not shown, it may be possible to drive a clamp transistor with a static voltage that ensures that VC does not rise above VMAX. It has been observed, however, that such a clamp with static operation causes a strong degradation in performance of the error amplifier 110, which is not an acceptable trade-off.

Figure 4:
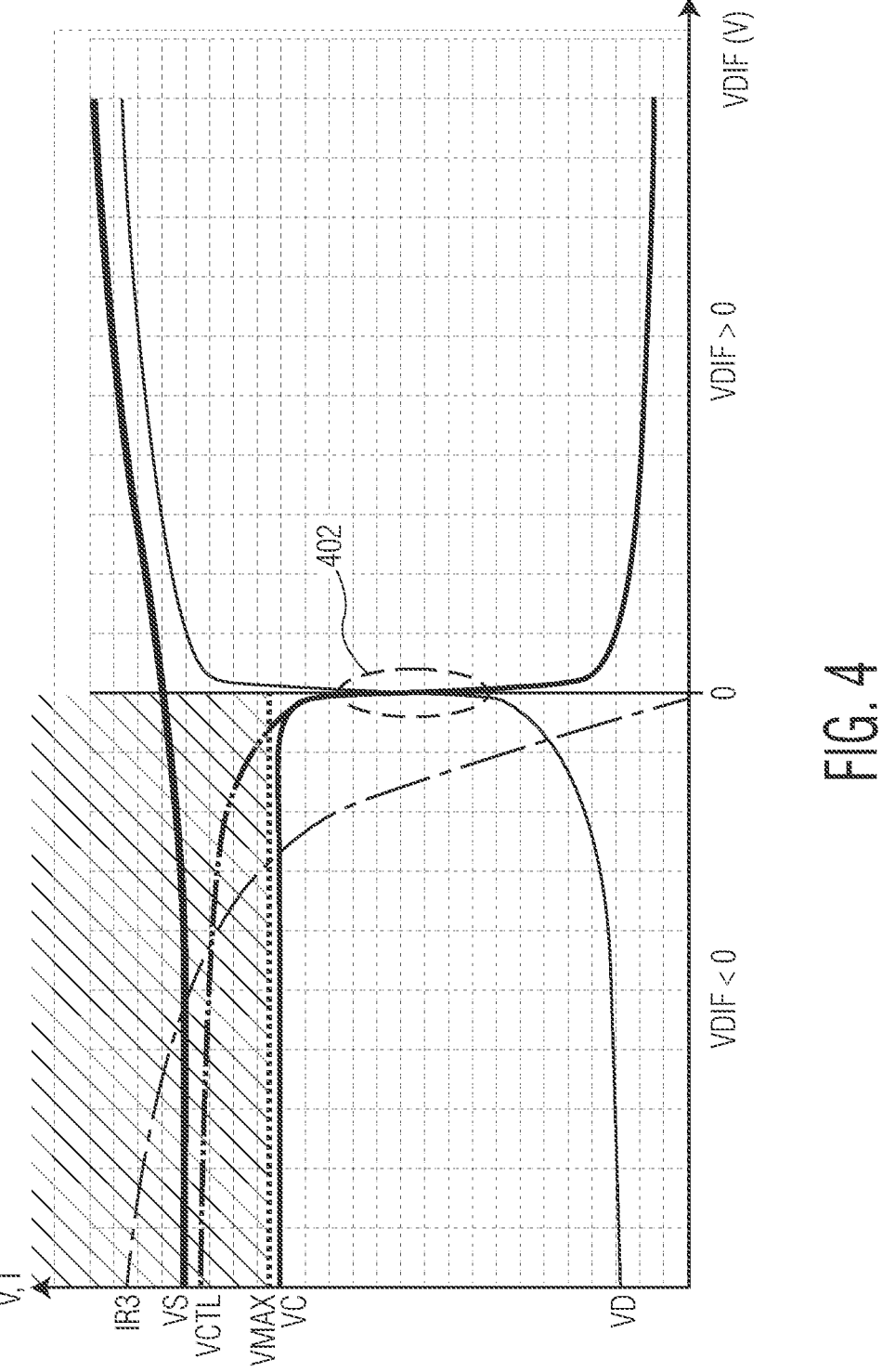
FIG. 4 is a graphic diagram plotting the various voltages and a current of the error amplifier of FIG. 1 with a protection device for the low voltage capacitor.

FIG. 4 is a graphic diagram plotting the voltages VS, VCTL, VC, VD, VMAX, and current IR3 through the resistor R3 versus VDIF of the error amplifier 110 when the protection device P3 is present and controlled by VD. Again, in one embodiment, VDIF ranges from about −0.55V to about 0.55V centered at 0V, and the vertical axis ranges from about 0V to about 2.5V. IR3 is effectively 0 microamperes (μA) when VDIF is positive and ranges from about 0 μA about 10 μA as VDIF goes negative. A linear region 402 is illustrated within a dashed line area when VFB and VREF are relatively close (e.g., within 2% of each other) so that VDIF is near 0V. The linear region 402 in this case exhibits desirable characteristics such that performance meets or otherwise exceeds requisite specifications. As VFB falls below VREF causing VDIF to go negative, operation transitions out of the linear region 402 and both VCTL and VC increase rapidly. In this case, however, P3 turns on before VC rises above VMAX and begins drawing current through R3, so that IR3 increases. At this point, VCTL separates from VC and is allowed to increase above VMAX in a similar manner previously described to keep VREG in regulation. VC, however, is effectively clamped by P3 at a level below VMAX during the extreme process, voltage, temperature and current operating conditions.

The voltage characteristics of VD, VCTL, and VC may first be determined during extreme process, voltage, temperature and current operating conditions, and then P3 may be configured accordingly to ensure that VC remains below VMAX during all such conditions. For example, the size of P3, such as its width and length parameters, may be determined based on the operating parameters to ensure that VC remains below VMAX during the extreme process, voltage, temperature and current operating conditions. In addition, the voltage-to-current characteristic at VDIF=0 remains unchanged with the addition of P3 so that loop gain remains unmodified and the output of the error amplifier 110 has no additional spread. In this manner, regression testing still passes and the distances to the limits of the specification remain the same.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An error amplifier, comprising:
   a differential pair circuit coupled between an upper supply node and a lower supply node with first and second intermediate nodes, wherein the differential pair circuit is responsive to a difference between a reference voltage and a feedback voltage for driving a control voltage developed on the second intermediate node;
   a resistive device coupled between the second intermediate node and a low voltage node;

a low voltage capacitor coupled between the low voltage node and the lower supply node; and
   a protection device coupled between the low voltage node and the lower supply node that is controlled by the first intermediate node to prevent the low voltage node from exceeding a predetermined maximum voltage level.

2. The error amplifier of claim 1, wherein the protection device comprises a P-type transistor having current terminals coupled between the low voltage node and the lower supply node and having a control terminal coupled to the first intermediate node.

3. The error amplifier of claim 1, wherein the differential pair circuit comprises:
   a current source coupled between an upper supply node and the upper source node;
   a differential pair comprising first and second P-type transistors, wherein the first P-type transistor has a first current terminal coupled to the upper source node, has a second current terminal coupled to the first intermediate node, and has a control terminal receiving the reference voltage, and wherein the second P-type transistor has a first current terminal coupled to the upper source node, has a second current terminal coupled to the second intermediate node developing the control voltage, and has a control terminal receiving the feedback voltage; and
   a resistive common-mode feedback load comprising first and second N-type transistors and a resistive circuit, wherein the first N-type transistor has a first current terminal coupled to the first intermediate node, has a second current terminal coupled to the lower supply node, and has a control terminal coupled to a gate node, and wherein the second N-type transistor has a first current terminal coupled to the second intermediate node, has a second current terminal coupled to the lower supply node, and has a control terminal coupled to the gate node;
   wherein the resistive circuit is coupled between the first and second intermediate nodes forming the gate node.

4. The error amplifier of claim 3, wherein the protection device comprises a third P-type transistor having current terminals coupled between the low voltage node and the lower supply node and having a control terminal coupled to the first intermediate node.

5. The error amplifier of claim 4, wherein the third P-type transistor has width and length parameters that are selected based on voltage characteristics of the first intermediate node during expected operating conditions.

6. The error amplifier of claim 1, wherein when the feedback voltage is decreased causing the control voltage to increase, the protection device is activated to draw current through the resistive device to prevent the low voltage node from exceeding the predetermined maximum voltage level.

7. The error amplifier of claim 1, wherein the low voltage capacitor comprises a high-density capacitor.

8. The error amplifier of claim 1, wherein the protection device is dynamically controlled to prevent the low voltage node from exceeding the predetermined maximum voltage level under expected process, voltage, and temperature variations.

9. The error amplifier of claim 1, further comprising:
   a voltage converter that adjusts the feedback voltage and that receives the control voltage to regulate an output voltage; and
   wherein the resistive device and the capacitor have selected values to achieve feedback loop stabilization.

10. A voltage regulator, comprising:

an error amplifier, comprising:

a differential pair circuit coupled between an upper supply node and a lower supply node with first and second intermediate nodes, wherein the differential pair circuit is responsive to a difference between a reference voltage and a feedback voltage for driving a control voltage developed on the second intermediate node;

a resistive device coupled between the second intermediate node and a low voltage node;

a low voltage capacitor coupled between the low voltage node and the lower supply node; and a protection device coupled between the low voltage node and the lower supply node that is controlled by the first intermediate node to prevent the low voltage node from exceeding a predetermined maximum voltage level; and a voltage converter that adjusts the feedback voltage to convert a supply voltage to a regulated voltage based on the control voltage.

11. The voltage regulator of claim 10, wherein the resistive device and the capacitor have selected values to achieve feedback loop stabilization.

12. The voltage regulator of claim 10, wherein the differential pair circuit comprises:

a current source coupled between the upper supply node and an upper source node;

a differential pair comprising first and second P-type transistors, wherein the first P-type transistor has a first current terminal coupled to the upper source node, has a second current terminal coupled to the first intermediate node, and has a control terminal receiving the reference voltage, and wherein the second P-type transistor has a first current terminal coupled to the upper source node, has a second current terminal coupled to the second intermediate node developing the control voltage, and has a control terminal receiving the feedback voltage; and a resistive common-mode feedback load comprising first and second N-type transistors and a resistive circuit, wherein the first N-type transistor has a first current terminal coupled to the first intermediate node, has a second current terminal coupled to the lower supply node, and has a control terminal coupled to a gate node, and wherein the second N-type transistor has a first current terminal coupled to the second intermediate node, has a second current terminal coupled to the lower supply node, and has a control terminal coupled to the gate node; and wherein the resistive circuit is coupled between the first and second intermediate nodes forming the gate node.

13. The voltage regulator of claim 12, wherein the protection device comprises a third P-type transistor having current terminals coupled between the low voltage node and the lower supply node and having a control terminal coupled to the first intermediate node.

14. The voltage regulator of claim 13, wherein the third P-type transistor has width and length parameters that are selected based on voltage characteristics of the first intermediate node during expected operating conditions.

15. The voltage regulator of claim 10, wherein when the voltage converter drives the feedback voltage low so that the error amplifier increases the control voltage above the predetermined maximum voltage level, the protection device is activated to draw current through the resistive device to prevent the low voltage node from exceeding the predetermined maximum voltage level.

16. The voltage regulator of claim 10, wherein the low voltage capacitor comprises a high-density capacitor.

17. The voltage regulator of claim 10, wherein the low voltage capacitor is integrated on the same integrated circuit as the error amplifier.

18. The voltage regulator of claim 10, wherein the protection device is dynamically controlled by the first intermediate node to prevent the low voltage node from exceeding the predetermined maximum voltage level under expected process, voltage, and temperature variations.

19. A method of protecting a low voltage capacitor provided on a higher voltage error amplifier including a differential pair circuit coupled between an upper supply node and a lower supply node with first and second intermediate nodes, a resistive device coupled between the second intermediate node and a low voltage node, and the capacitor coupled between the low voltage node and the lower supply node, wherein the differential pair circuit is responsive to a difference between a reference voltage and a feedback voltage for driving a control voltage developed on the second intermediate node, the method comprising:

providing a protection device that is coupled between the low voltage node and the lower supply node; and dynamically controlling the protection device by the first intermediate node to prevent the low voltage node from exceeding a predetermined maximum voltage level.

20. The method of claim 19, wherein the providing a protection device comprises providing the protection device as a P-type transistor having a width and length selected based on voltage characteristics of the first intermediate node under expected process, voltage, and temperature variations.

* * * * *